United States Patent
Perälä et al.

[11] Patent Number: 5,613,330
[45] Date of Patent: Mar. 25, 1997

[54] SUPPORT PILLAR SYSTEM FOR A MAGNETICALLY-SHIELDED ROOM

[75] Inventors: Martti Perälä; Lasse Sohlström, both of Eura, Finland

[73] Assignee: Euroshield Oy, Eura, Finland

[21] Appl. No.: 578,012

[22] Filed: Dec. 26, 1995

[30] Foreign Application Priority Data

Dec. 27, 1994 [FI] Finland ..................... 946102

[51] Int. Cl.$^6$ ............. F02D 27/34; H05K 9/00
[52] U.S. Cl. ................. 52/167.1; 52/167.8; 52/263; 174/35 MS File
[58] Field of Search ............ 52/167.1, 167.4, 52/167.8, 263, 293; 248/354.3, 354.6, 354.7; 74/35 MS File

[56] References Cited

U.S. PATENT DOCUMENTS

| | | | |
|---|---|---|---|
| 3,557,777 | 1/1971 | Cohen | 174/35 MS X |
| 3,606,704 | 9/1971 | Denton | 52/167.8 |
| 4,438,610 | 3/1984 | Fifer | 52/263 |
| 4,561,209 | 12/1985 | Sohlstrom | 49/246 |
| 4,736,555 | 4/1988 | Nagare et al. | 52/167.1 X |
| 4,753,038 | 6/1988 | Sohlstrom | 49/212 |
| 4,850,162 | 7/1989 | Albrecht | 52/263 X |
| 4,922,667 | 5/1990 | Kobori et al. | 52/167.1 X |
| 4,959,504 | 9/1990 | Yarger et al. | 174/35 MS |
| 4,996,804 | 3/1991 | Naka et al. | 52/263 X |

FOREIGN PATENT DOCUMENTS

| | | |
|---|---|---|
| 63992 | 5/1983 | Finland . |
| 73043 | 4/1987 | Finland . |
| 62-141226 | 7/1987 | Japan ..................... 52/167.8 |

Primary Examiner—Carl D. Friedman
Assistant Examiner—Winnie Yip
Attorney, Agent, or Firm—Steinberg, Raskin & Davidson, P.C.

[57] ABSTRACT

A support pillar system for a magnetically-shielded room including several support pillars, each support pillar including a nested structure formed by a first structure and a second structure surrounding the first structure. The upper end of the first structure has a threaded part and a member provided with a thread and disposed about the threaded part. The shielding structure of the magnetically-shielded room is attached to the second structure of the support pillar, whereby the floor of the room is supported on the upper end of the first structure. When the member provided with a thread is tightened in a locking position, it locks the first structure and the second structure together, whereby the vibration of the floor is transmitted to the shielding structure and the shield vibrates substantially in synchronization with the vibration of the floor of the room. When the member is threaded into an open, unlocked position, the locking of the second structure is released vis-a-vis the first structure, whereby the inner room is allowed to vibrate, irrespective of the vibration of the other shield structures, and hence, the potential vibration of the room is not transmitted to the shielding structures.

8 Claims, 3 Drawing Sheets

SUPPORT PILLAR SYSTEM FOR A MAGNETICALLY-SHIELDED ROOM

FIELD OF THE INVENTION

The present invention relates to a support pillar system for a magnetically-shielded room.

BACKGROUND OF THE INVENTION

For providing an interference-shielded space, the function of the structures used to house the space can be to prevent penetration of external electromagnetic energy into the shielded space or also to limit the electromagnetic energy within a space surrounded by the structure by preventing leakage of an interfering field into the surroundings. Structures of this type are known in the art and they are generally used for shielding sensitive structures against electromagnetic radiation and for enabling measurements free of radio frequency interferences, e.g., in industries employing data transmission and high frequency technology, in research, and, e.g., in hospitals. Irrespective of the use of the shielded space, the most poorly absorbing part in the shielding is usually formed by the contact point between a door, window, hatch or equivalent element to be opened for access into the shielded space and the fixed structure.

To avoid the deterioration if the shielding properties of the door, the electric contact of the moving part of the door and the door frame, and the redundance path, when shielding against low-frequency magnetic field, is required to be as continuous as possible and correspond to the properties of the rest of the structure. The absorption properties of the joint between the door and the frame can be improved, above all at high frequencies, with a labyrinth structure positioned at the point of contact where, for ensuring the contact, knife-like contact tongues are pressed between the contact springs disposed in a runner running around the aperture.

However, in prior art door designs, the performance values achieved in practice have been limited by the fact that using a repeated labyrinth structure has not been possible, because of the requisite tight fits, so that the normal convenience of use of the door and the operation properties of a door hinged in a normal way are maintained. When an efficient and complicated labyrinth structure is used, the contact tongues penetrating between the springs tend to, owing to the tight fits, damage the sealing structure by urging the sealing springs off from their locations by means of the swivelling movement of a normally turning door, and on the other hand, closing such door requires enormous press force, e.g., from about 100 kp to about 150 kp.

Finnish Patent No. 63992, corresponding to U.S. Pat. No. 4,561,209 incorporated by reference, discloses a door in a structure intended for prevention of the transmission of interference fields in which the movement of the door is provided by a rotary movement around an axis determined by hinge means and by a substantially rectilinear movement producing a contact which prevents transmission of interference fields. However, it has turned out to be that, particularly in large-size door designs, the rotary movement around the axle is not the best possible solution. In such instances, the heavy weight of the door poses high requirements on the hinge means. Thus, the large forces and torques directed at the rotary hinging of the heavy door structure create more stress in the hinging than in light-weight door structures.

Finnish Patent No. 73043, corresponding to U.S. Pat. No. 4,753,038 incorporated by reference herein, discloses a door in a structure to prevent transmission of interference fields, particularly high-frequency electromagnetic fields, relative to which the door has been arranged to be moved with hinge means and whereby the door and/or fixed structure has/have been provided with members to have a contact between the door and the fixed structure to prevent the transmission of interference fields. The door has been arranged to move with the aid of first hinge means substantially rectilinearly in a direction which is in the direction of the normal to the plane of the door, and with the aid of second hinge means substantially in the direction of the plane of the door. The first hinge means comprise first coupling means and second coupling means, either of which having been disposed to move while in contact with the cooperative coupling means. The first coupling means consist of a toothed wheel and the second coupling means consist of a pinion rack, whereby the toothed wheel has been arranged to move along the teeth of the rack. The second hinge means comprise rollers supported by which the door has been arranged to move on a guide bar.

The interferences inhibiting precise magnetic measurements can be classified into two groups: those caused by humans and those cause by nature, such as the magnetic field of the earth. When moving far off from the sphere influenced by the humans, an environment is created in which the disturbances caused by humans are insignificant. In general, it is desirable to make measurements in a laboratory environment. Now, powerful interferences are caused, among other things, by lifts or elevators, vibrations of the constructional steels, passing vehicles, and electric apparatus. In a magnetically-shielded room, endeavors are made to absorb interferences of the laboratory surroundings to the extent that research applying the most sensitive measurement devices is possible in the "inner interiors" of the room.

Magnetic shielding is implemented utilizing three different methods. These are as follows: passive ferromagnetic shielding, swirl shielding, and active compensation of the interference field. The ferromagnetic shielding consists of one or more nested $\mu$ metal shells. Each wall is made of two $\mu$ metal layers, the metal strips of which are positioned, e.g., cross-wise. The $\mu$ metal layers have been mounted between two aluminum sheets (having thicknesses of, e.g., 2 mm and 5 mm). The 5 mm aluminum sheets serving as the support structure have been joined to each other to form a uniform structure conducting electricity well. In such a structure, the inducing swirls absorb the alternating current magnetic field which is trying to enter the interior. An active shielding is implemented with coils installed around the magnetic-shielded room, to which the electric current is conducted, the magnetic field generated by which is as great within the magnetic-shielded room but reverse in direction as the external interfering magnetic field trying to enter the room. The active shielding is efficient at low frequencies and its shielding capacity is limited merely by the noise of the magneto-meters and electronic apparatus used.

The properties of passive ferromagnetic shielding may be enhanced considerably by superposing a relatively large alternating current magnetic field ($H_S$=5 A/m, rms) into an interference, whereby the effective permeability of the $\mu$ metal increases significantly, thus causing an increase in the shielding factor. In modern English, this type of processing is called "shaking".

It is possible to shield against static and slowly varying magnetic fields on a large scale merely by building the walls of the space to be shielded from $\mu$ metal or by using active compensation of the magnetic field. A material of high permeability can be thought of acting as a good conductor concerning a magnetic field and shielding the space enclosed therewith by conducting the fields into itself. The shielding factor of the ferromagnetic shell is proportional to the permeability of the material and the thickness of the shell layer. By building a multiple-layer shield, a higher shielding factor can be obtained with the same quantity of material than by using one single screen of the same weight.

Shaking or superposing alternating current magnetic field on the walls of the shield has clearly been found to improve the shielding factor. The effective permeability of the μ metal is improved with shaking treatment into two to seven times greater in 0 to 100 Hz frequency range. The shaking frequency can in practice be varied in the range 3 to 200 Hz. The most useful frequency is in general the 50 Hz mains frequency because the shaking causes a relatively strong interference field in a shielded space. On the mains frequency, the interference level has already been high, and preparations have to be made in any case to absorb the interferences, e.g. using filtering in the measurement apparatus. The shielding factor has been found to be improved both at interference frequencies above and below the shaking frequency.

If the walls of the shielded space have been built from a conductive material, the swirls produced in the shielding shell absorb the varying interference field within the room. It goes without saying that the static field is not affected by the swirl shielding at all. The swirls commence to exert their effect at frequencies at which the penetration depth of an interference field is of the order of the thickness of the shielding shell. As the frequency increases, the shielding factor caused by the swirls increases exponentially. The upper limit of the shielding factor is determined by the field entering the room through apertures and joints.

Active compensation apparatus of magnetic fields are used in a multitude of applications, not however in general in combination with passive shielding methods. The magnitude of an interference magnetic field is measured at a distance from the target to be shielded, with the purpose that the magnetic field produced by the compensation coil would have no effect on the measurement. The current of the compensation coil is controlled with a precise current generator so that it is directly proportional to the interference field being measured. An interference field may also be measured at a number of points, and the current of the compensation coils can be controlled according to the appropriately weighted mean of the measurement values.

If, in a magnetic shielding using merely active compensation, the interference magnetic field is measured in the proximity of a shielded space or therewithin, also the magnetic field being studied is compensated in addition to the interference field so that the closed control of the current of the compensation coils is not functional.

When active compensation is used in conjunction with passive magnetic shielding, a closed control of the current of the compensation coil is conceivable.

The current of the compensation coil is controlled by a closed control circuit which tends to maintain the measured magnetic field constant. After the measured magnetic field is stabilized, also the residual field prevailing in the magnetic-shielded space is constant.

In practice, the residual field cannot be turned completely into a constant field because the magnetic field provided by the compensation coil is not homogeneous in the shielded space.

When estimating the shielding factor of a magnetic-shielded room, three situations and shielding mechanisms differing from each other can be identified:

(A) Shielding caused by a ferromagnetic material to the static field of the earth, that is, the static shielding.

(B) Shielding caused by a ferromagnetic material against slowly varying interference fields (f<1 Hz), that is, so-called quasistatic shielding.

(C) Combined effect of swirls and ferromagnetic shielding with increased frequency (f>1 Hz), that is, dynamic shielding.

The above frequency limits are exemplary and dependent on the thickness of the walls of the shield and the materials used.

When someone walks on the inner floor of a magnetic-shielded room or, e.g., sits down on a chair, it causes the phenomenon that the inner room vibrates, at least to some extent. Since, e.g., highly sensitive measurements are accomplished, e.g., on patients in the magnetic-shielded room, the vibration of the inner room is a harmful and undesirable phenomenon.

Nowadays there are two different opinions on this matter. The first opinion is that the vibration of the inner room should not be transferred into the shield wall structure surrounding the magnetic-shielded room. The other opinion is that the vibration of the inner room must be synchronous with the vibration of the shield structure because, in spite of all, the inner room always vibrates to some extent.

OBJECTS AND SUMMARY OF THE INVENTION

Accordingly, it is an object of the present invention to provide a support pillar system for a magnetically-shielded room by means of which it is either possible to prevent vibration of the inner room from being transmitted to the shielding structure, or that the shielding structure vibrates in synchronization with the vibration of the inner room.

In the support pillar system of a magnetically-shielded room in accordance with the invention, each support pillar of the support pillar system comprises a nested structure formed by a first structure and a second structure surrounding the first structure. At the upper end of the first structure, a threaded part is provided, and a member is also provided with a corresponding thread disposed in the threaded part. The shield structure of the magnetically-shielded room is attached to the second structure of the support pillar, whereby the floor of the inner room is supported on the upper end of the first structure. When the member provided with a thread and disposed in the threaded part is tightened in a locking position, the member provided with the thread locks the first structure and the second structure into one and same entity, i.e., together and to each other. In this manner, the vibration of the inner floor is transferred to the shield structure and the shield structure vibrates substantially in synchronization with the vibration of the inner room floor. When the member provided with the thread is rotated into an open or unlocking position, the locking of the second structure is released, whereby the inner room is allowed to vibrate irrespective of, i.e., independent of, the vibration of the other shield structures and thereby, the potential vibrations of the inner room are not transmitted to the shield structures.

In view of the support pillar system of the invention, the vibration of the inner room is directly transmitted, e.g., to the bedrock or foundation of the building, so that the vibration of the inner room is not transmitted to the shield structure surrounding the magnetically-shielded room and thus would not therethrough cause inaccuracy in, e.g., sensitive measurements. On the other hand, the support pillar system of the invention permits that, when desired, the shield structure around the magnetically-shielded room can be made to vibrate in synchronization with the vibration of the inner room, if this design is considered to be most preferred considering the sensitive measurements.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
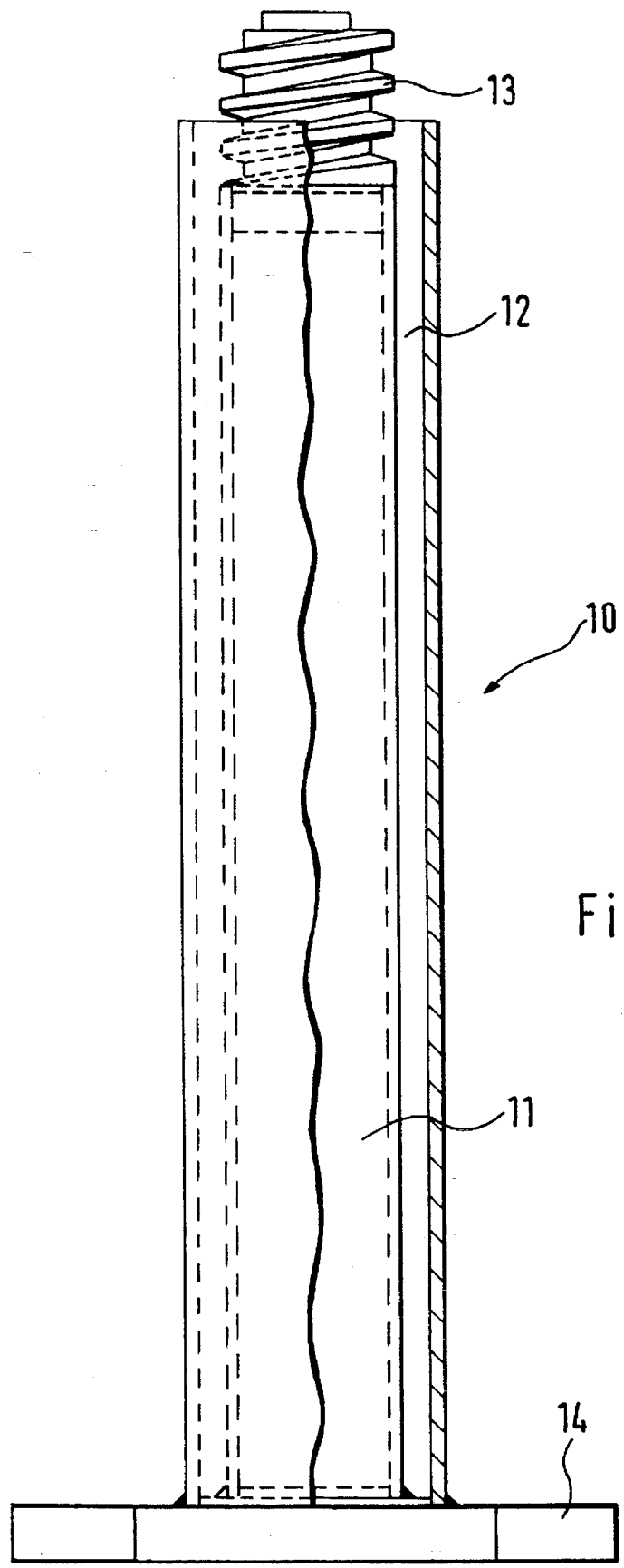
FIG. 1 shows an advantageous embodiment of a support pillar of the support pillar system in accordance with the invention in lateral view.
Figure 2:
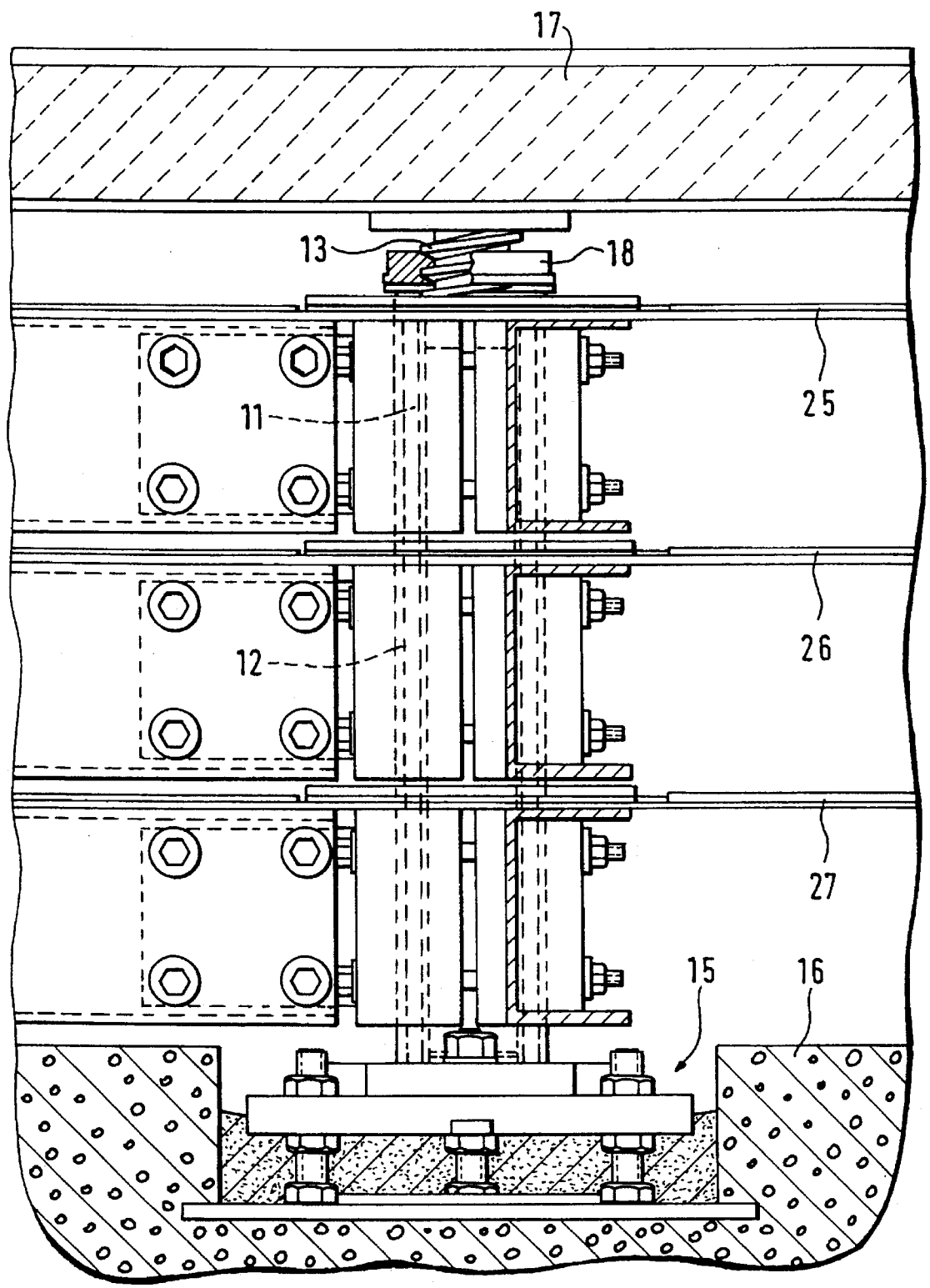
FIG. 2 presents the support pillar of FIG. 1 as a lateral view mounted on the bedrock and to the floor of the inner room.
Figure 3:
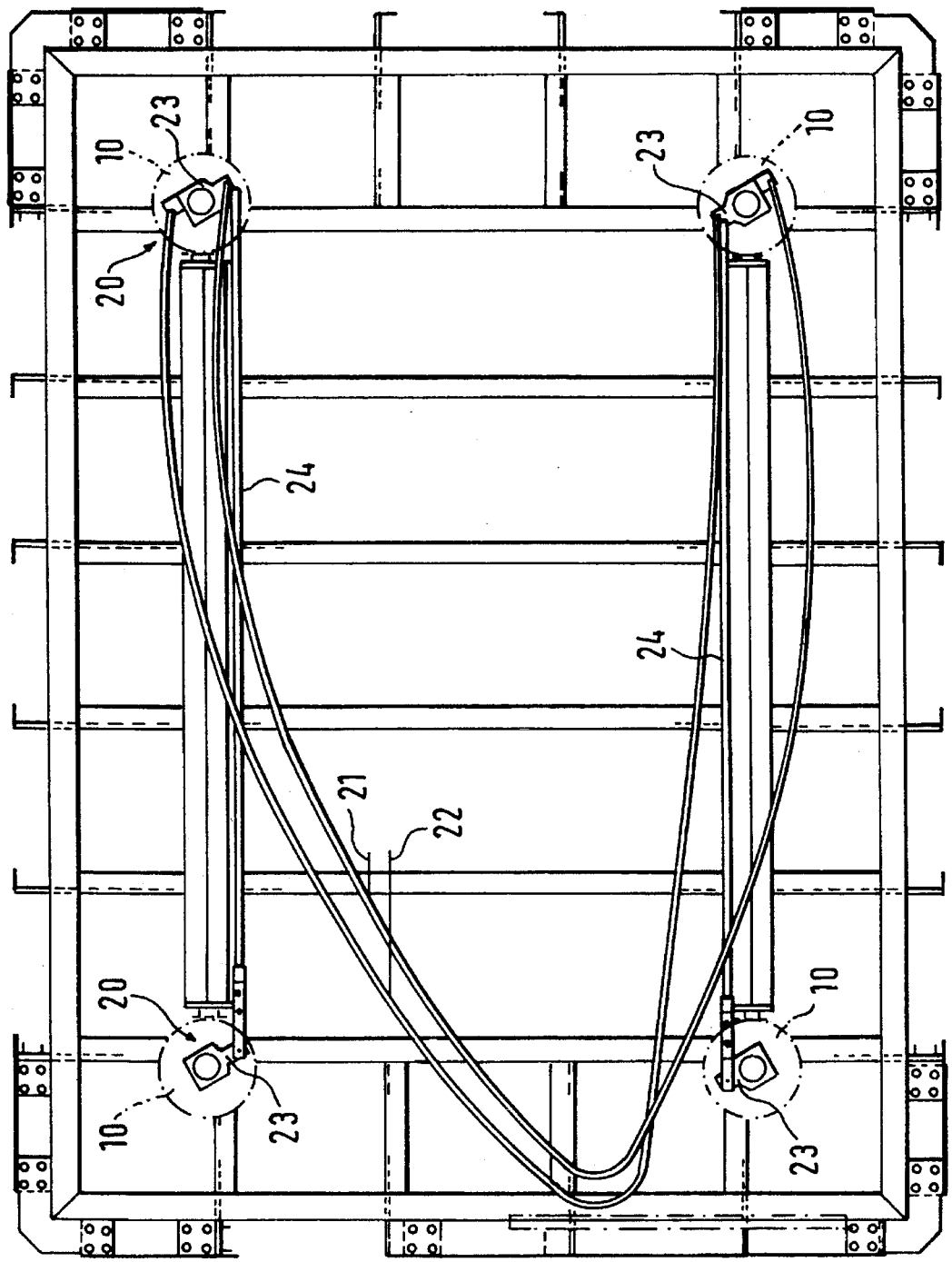
FIG. 3 presents an advantageous embodiment of the support pillar system of the invention in top view.

Referring to the accompanying drawings wherein the same reference numerals refer to the same or similar elements, in the embodiment shown in FIGS. 1, 2 and 3, the support pillar of a support pillar system in accordance with the invention is in general indicated by reference numeral 10. In this embodiment, the support pillar system comprises four separate support pillars which support an inner room. Each support pillar 10 comprises a first tubular structure 11, which constitutes an inner pipe, and a second tubular structure 12, which constitutes an outer pipe. The upper end of the inner pipe 11 is provided with a so-called trapezoidal thread 13. The lower end of the inner pipe 11 and the outer pipe 12 are mounted to a flange 14. The support pillar 10 can be mounted to bedrock 16, e.g., using the mounting system presented in FIG. 2, indicated in general by reference numeral 15. The invention is not, however, in any way critical to the way in which the pillar 10 is mounted to the bedrock 16 or other foundation. A floor 17 of the inner room is supported on the upper end of the inner pipe 11, preferably to a flange disposed on the upper end of the inner pipe 11. A locking member or nut 18 cooperates with thread 13 and is effective to move a separate or integral pressing member against the outer pipe 12.

In the embodiment shown in FIG. 2, the magnetically-shielded room is surrounded by a three-ply shield structure, the first layer being indicated by reference numeral 25, the second by reference numeral 26, and the third by reference numeral 27. The shield structures 25, 26, 27 can be any shield structures known in the art, and the invention is not critical regarding the shield structure design used. With regard to the invention, the essential feature is that the shield structures 25, 26, 27 are mounted in engagement with, and preferably attached to, the outer pipe 12 of the support pillar 10.

When the nut 18 is tightened into a locking position, the nut 18 locks the inner pipe 11, by movement of the flange, and the outer pipe 12 into one and same assembly. As such, the vibrations of the floor 17 of the inner room are transmitted to the shield structure 25, 26, 27 and the shield structure vibrates essentially in synchronization with the vibrations of the floor 17 of the inner room. When the locking nut 18 is threaded open, the locking of the outer pipe 12 is released, whereby the inner room is allowed to vibrate irrespective of, not as a function of, the vibration of the other shield structures 25, 26, 27. In this manner, the potential vibration of the inner room is not directly transmitted to the shield structures 25, 26 and 27.

In the embodiment shown in FIG. 3, the floor of the inner room is supported by four support pillars 10 in accordance with the invention. In this embodiment, on top of the locking nut 18 shown in FIG. 2 on each of the pillars, a locking/opening member 23 is attached. A locking/opening mechanism 20 is arranged in conjunction with the locking/opening members 23 and comprises a first string or equivalent 21 and a second string or equivalent 22, and the locking/opening members 23 attached to the respective nuts 18. The locking/opening members 23 are connected in pairs by intermediate rods 24 to each other. In the present embodiment, the strings 21 and 22 and the intermediate rods 24 are fastened to the locking/opening members 23 in the right hand side support pillars 10, the locking/opening members rotating the nuts 18 in the trapezoidal threads 13. When pulling from string 21, the pipes 11 and 12 are interlocked. If instead, string 22 is pulled, the locking of the pipes 11 and 12 is released and thus opened. With regard to the invention, identification means may be connected to the strings. For example, it may be relevant that the first string 21 is, e.g., a red string and the other string 22 is, e.g., a blue string, so that the locking and opening operations of the pipes 11 and 12 are as clear as possible, eliminating the risk of confusion.

The examples provided above are not meant to be exclusive. Many other variations of the present invention would be obvious to those skilled in the art, and are contemplated to be within the scope of the appended claims. For example, the locking nut 18 can be moved manually between the locking position in which the outer structure 12 is locked together with the inner structure 11 and the unlocked position. Alternatively, other means for selectively locking and unlocking the engagement of the first and second structure can be utilized.

We claim:

1. A support pillar system for a magnetically-shielded room, comprising a plurality of support pillars, each of said support pillars comprising a first inner structure having a threaded upper end, a second outer structure surrounding said first structure, and a member having a thread cooperating with said threaded upper end of said first structure, a floor of the room being supported on said threaded upper end of said first structure, magnetic shielding means for magnetically shielding the room, said shielding means being attached to said second structure, and movement means for moving each of said members between a locking position in which said first structure and said second structure are locked together such that vibration of the floor of the room is transmitted to said shielding means and said shielding means vibrates substantially in synchronization with the vibration of the floor of the room and an open position in which said second structure is not locked with said first structure and the vibration of the room is not dependent on the vibration of said shielding means such that potential vibration of the room is not transmitted to said shielding means.

2. The support pillar system of claim 1, wherein said movement means comprise a locking/opening mechanism including a locking/opening member attached to said member and first and second connecting members for connecting at least two of said locking/opening members together.

3. The support pillar system of claim 2, wherein said movement means further comprise intermediate rods for interconnecting pairs of said locking/opening members.

4. The support pillar system of claim 2, wherein said first and second connecting members comprise strings.

5. The support pillar system of claim 2, wherein said first and second structures are nested tubular structures.

6. The support pillar system of claim 1, wherein said threaded upper end of said first structure has a trapezoidal thread, further comprising a flange on which a lower end of each of said first and second structures is mounted.

7. The support pillar system of claim 1, further comprising mounting means for mounting each of said support pillars to a foundation.

8. The support pillar system of claim 1, wherein said shielding means comprise a multilayer structure, each of said layers being separately attached to said second structure.

* * * * *